United States Patent [19]

Eberhardt, André et al.

[11] Patent Number: 4,857,387

[45] Date of Patent: Aug. 15, 1989

[54] COMPENSATING ELEMENT FOR STRESSES OF THERMAL OR MECHANICAL ORGIN, ESPECIALLY FOR PRINTED CIRCUITS, AND PROCESS FOR MAKING SUCH AN ELEMENT EMPLOYED IN A PRINTED CIRCUIT

[75] Inventors: Eberhardt, André, Metz; Serge Dominiak, Ars sur Moselle; Marcel Berveiller, Woippy; Jean P. Lucas, Metz; Robert P. Y. Guyon, Vigy, all of France

[73] Assignee: Cimulec, S.A., Vigy, France

[21] Appl. No.: 113,420

[22] Filed: Oct. 27, 1987

[30] Foreign Application Priority Data

Oct. 28, 1986 [FR] France ................................. 86 15101

[51] Int. Cl.$^4$ ................................................ B32B 9/00
[52] U.S. Cl. ..................................... 428/209; 428/220; 428/334; 428/426; 428/432; 428/544; 428/548; 428/607; 428/615; 428/617; 428/901; 428/335; 174/68.5; 361/397
[58] Field of Search ............... 428/137, 209, 332, 426, 428/432, 544, 548, 601, 615, 617, 901, 220, 334, 335; 174/68.5; 361/397

[56] References Cited

U.S. PATENT DOCUMENTS 3,594,895 7/1971 Hill et al. .
3,599,316 8/1971 Moskal .
4,458,254 7/1984 Womack ............................ 361/321

OTHER PUBLICATIONS

"Some Applications of Shape-Memory Alloys", *Journal of Metals,* vol. 32, No. 6, Jun. 1980, by C. M. Wayman, pp. 129–136.
"Electronics Review", Electronics International, vol. 56, No. 5, Mar. 1983, pp. 48–49.

*Primary Examiner*—Ellis P. Robinson
*Assistant Examiner*—P. J. Ryan
*Attorney, Agent, or Firm*—Young & Thompson

[57] ABSTRACT

A printed circuit comprising an electrically insulating substrate and an electrically conductive layer on the substrate, this layer being a pseudo-elastic or elastically deformable alloy that undergoes significant deformations in a reversible manner and is a copper alloy containing at least 50% by weight copper in the form of large-grained polycrystals that undergo martensitic transformation. Preferably, the layer contains 60–80% by weight of copper, the large-grained polycrystals having a grain size of at least about 3 mm. The martensitic transformation takes place within the temperature range −55° C. to +125° C., and the layer has a thickness between 30μ and 200μ, preferably about 100μ.

9 Claims, No Drawings

COMPENSATING ELEMENT FOR STRESSES OF THERMAL OR MECHANICAL ORGIN, ESPECIALLY FOR PRINTED CIRCUITS, AND PROCESS FOR MAKING SUCH AN ELEMENT EMPLOYED IN A PRINTED CIRCUIT

The present invention concerns an element for compensating stresses of thermal or mechanical origin, especially for printed circuits, and a process for making such an element employed in a printed circuit.

The difference in the coefficients of thermal expansion of the components of an assembly gives rise to mechanical stresses, the amplitude of which may cause deterioration of the assembly. The solutions envisioned at present for improving the performance of the assemblies are principally of two types.

either the coefficients of expansion are selected such that the expansion differential is slight, or an intermediate element, deformable in a reversible manner, is interposed between the parts of the assembly.

By way of example, printed circuits are themselves constituted of an insulating support and copper conducting layers which constitute the set of connections, at least one of which is situated on one of the external faces of the support and allows soldering of components. This insulating support is formed from an organic material, usually glass fiber-epoxy resin, or polyimide glass fiber, the expansion coefficient of which is about $14 \times 10^{-6}(°C.)^{-1}$. The operating temperature of printed circuits frequently varies, however, from $-55°$ C. to $+125°$ C. Printed circuits conventionally support components that are fixed thereon via their terminals. These latter absorb the expansion difference by deformation. Now, electronic developments impose an ever increasing density of components to be fixed on the printed circuit. This is why surface welding is used more and more on printed circuits. When it is casings for integrated circuits, formed from a polymeric material, that are fixed in this manner, they are able to expand in the same manner as the printed circuit at the time of temperature variations, and no stresses arise. On the other hand, when they are formed from a ceramic material, which is used essentially for its insulating properties, the coefficient of expansion is about $5 \times 10^{-6}(°C.)^{-1}$. Thus, with a relatively long ceramic component (for example 2 cm in length) having a coefficient of expansion of $5.10^{-6}(°C.)^{-1}$, a decrease in temperature from $+125°$ C. to 55° C. causes a contraction of only $8.4\mu$, whereas the support of organic material such as glass fiber-epoxy resin or polyimide glass fiber will contract $19.6\mu$, causing an expansion difference of $11.2\mu$, which is generally sufficient to cause stresses and cracks in the tin-lead alloy solders joining the extremities of the components to their connection points on the printed circuit. Thus, at the time of the various thermal cycles, the solder seams are subjected to strong mechanical stresses that can cause rupture of these solders.

It has accordingly been proposed to modify the nature of the support itself by selecting materials having a coefficient of expansion close to the coefficient of expansion of ceramic. But such a change in material causes numerous other disadvantages. For example, a support of the Epoxy-Kevlar type (Kevlar: trade name of the company DuPont de Nemours) undergoes softening and a physical modification at a temperature of $+125°$ C. Moreover, the thermal conductivity of such a support is very slight, which means that the heat evolved by the integrated circuits is not dissipated. Finally, such a resin support easily cracks, which may cause defects.

A support of quartz fiber and epoxy (or polyimide) resin is very difficult to machine and to penetrate, so that manufacture of printed circuits with such a support is very costly. A Kevlar-polyimide support also has very slight conductivity. Moreover, it strongly absorbs moisture. A high percentage of fractures generally appears at the time of manufacture.

It has also been proposed to use a conventional support reinforced with a metallic core of the copper-invar-copper type, but this solution gives rise to an excessively high weight. There is thus no satisfactory solution that takes account of all of these factors.

It has accordingly been proposed to coat a conventional support, namely of glass fiber-epoxy resin or glass fiber-polyimide, with a deformable elastomeric layer of a polymeric material. But this approach has the disadvantage that the conducting layer expands not only in the plane of the printed circuit, but also perpendicularly to the plane of the printed circuit, which influences the strength of interconnection between layers and causes a rupture of the metalizations disposed in the metalized openings of the printed circuits and intended to ensure connection between each face of the printed circuits.

At present, problems also arise in an identical manner, for example on glass-metal insulating passages. Specifically, the coefficients of expansion of the different materials are adjusted. Nevertheless, if thereafter these devices are subject to an overall deformation influencing the heterogeneity of the modules of elasticity of the materials, a rupture or detachment at the level of the interface will arise, due to the mechanical stresses.

The present invention seeks to overcome these disadvantages.

Specifically, it has as an object an element for compensating stresses of thermal and/or mechanical origin in a solid body formed from different materials, resulting either from the difference in coefficients of expansion of the said materials, or from the difference of their modules of elasticity, the element being characterized in that it is partially or completely constituted of a pseudo-elastic or elastically deformable alloy that is acted on in a reversible manner by significant deformations, even under very slight stress.

The invention will best be understood thanks to the following description of a first preferred embodiment, given by way of non-limiting example, of a printed circuit having a base conducting layer of its support that is constituted by such a compensating element.

According to the invention, the compensating element is completely constituted of a pseudo-elastic or elastically deformable alloy that is acted on in a reversible manner by significant deformations, even under very slight stresses, and forms the base conducting layer of the support of a printed circuit, thus permitting limiting stresses of thermal origin resulting from the difference between the coefficients of expansion of the casings of the integrated circuits supported by the printed circuit, on the one hand, and of the support of the printed circuit on the other hand, thanks to a martensitic transformation in a temperature interval corresponding to the region of thermal cycling.

Thus, this conducting layer may be acted on in a reversible manner by significant deformations, only in two dimensions, namely in the plane of the printed circuit.

The layer is moreover composed of very large-grained polycrystals, so as to permit greater deformation. Specifically, so as to ensure reversibility, the onset of martensitic transformation must be able to be displaced without difficulty. The size of the grains is greater than or equal to about 3 mm.

This layer replaces the conventional layer of copper, as well as that of polymer. Consequently, it must be conducting and to this end contain at least 50% by weight copper, preferably 60 to 80%.

The choice of the other constituents of the conducting layer is determined especially by the choice of the temperature $M_S$ for onset of martensitic transformation. But a certain number of other criteria also come to bear, such as ability to receive a deposit of copper, weldability to the tin-lead alloy, or also the possibilities of shaping, for example by hot or cold rolling in the two-phase region with intermediate annealing.

According to a variation of the invention, the conducting layer may be a pseudo-elastic or elastically deformable alloy of Cu Zn Al. With such a composition, the temperature interval may b disposed where martensitic transformation is generated between the temperature extremes of the cycle, namely from $-55°$ C. to $+125°$ C. By way of example, the composition will be 73.5% by weight Cu, 20.5% by weight Zn and 6% by weight Al, for a martensitic transformation onset temperature $M_S$ of 60° C. For a temperature $M_S$ of $-10°$ C., these percentages will be 74.42% by weight Cu, 18.45% by weight Zn and 7.13% by weight Al.

According to another variation of the invention, the conducting layer could be a pseudo-elastic or elastically deformable alloy of Cu Zn Sn. More generally, it could be composed of the following alloys: Cu Zn, Cu Zn Ni, Cu Zn Ag, Cu Zn Au, Cu Zn Cd, Cu Zn Ga, Cu Zn In, Cu Zn Ge, Cu Zn Sb, Cu Zn Si, Cu Sn, Cu Al Ni, Cu Al, Cu Zn Al Ni, and also more generally of any conductors that are elastically deformable or pseudo elastic. The thickness of the conducting layer is comprised between $30\mu$ and $200\mu$, advantageously 11 82 .

The invention also has as an object a process for producing a printed circuit comprising a compensating element according to the invention, which consists of preparing thin polycrystalline sheets from an elastically deformable or pseudo-elastic conducting material, then of assembling by any known means these sheets forming the conducting layer on the upper and/or lower surfaces of the support of the printed circuit.

By way of example, the conducting layer could be glued onto the upper and/or lower face of the support of the printed circuit.

The strong reversible deformation afforded by the pseudo-elastic or elastically deformable materials forming the conducting layer will thus permit considerably limiting stresses of the thermal origin responsible for cracks at the level of the welding seams.

The compensating element according to the invention moreover permits a superior dissipation of the thermal accumulation, has the advantage of being light, and requires no significant modification in the steps of production.

Moreover, the invention also has as an object a process for producing an electronic component casing comprising a compensating element according to the invention, using an alloy identical to the conducting layer as defined in the invention, which consists of preparing exterior connecting elements, in a pseudo-elastic or elastically deformable material, then of assembling by any known means these connecting elements on the casing of the electronic component so as to ensure an electrical and mechanical connection between the electronic component and the printed circuit.

According to a second embodiment of the invention, The compensating element constitutes the interface of a glass-metal passage, thus permitting limiting stresses of mechanical origin resulting from the difference between the modulus of elasticity of glass, on the one hand, and that of metal on the other hand. Thus, a layer of a pseudo-elastic or elastically deformable material disposed between the glass and the metal, for example by gluing, permits considerably limiting the stresses of mechanical origin responsible for cracks or detachment at the level of the interface.

It will be understood that the invention is not limited to the embodiments described. Modifications remain possible, particularly from the point of view of the constitution of the various elements, or substitution of equivalent techniques, without departing whatsoever from the scope of protection of the invention.

We claim:

1. A printed circuit comprising an electrically insulating substrate and an electrically conductive layer on said substrate, said layer having a thickness between $30\mu$ and $200\mu$ and being a pseudo-elastic alloy that undergoes significant deformations in a reversible manner, said layer being a copper alloy consisting essentially of at least 50% by weight copper in the form of large-grained polycrystals that undergo martensitic transformation and at least one other metal selected from the group consisting of tin, zinc, aluminum, nickel, silver, gold cadmium, gallium, indium, germamium, antimony and silicon.

2. A printed circuit as claimed in claim 1, in which said layer contains 60-80% by weight of copper.

3. A printed circuit as claimed in claim 2, in which said layer consists essentially of about 73.5% by weight copper, 20.5% by weight zinc, and 6% by weight aluminum.

4. A printed circuit as claimed in claim 2, in which said layer consists essentially of about 74.42% by weight copper, 18.45% by weight zinc, and 7.13% by weight aluminum.

5. A printed circuit as claimed in claim 1, in which said large-grained polycrystals have a grain size of at least about 3 mm.

6. A printed circuit as claimed in claim 1, in which said martensitic transformation takes place within the temperature range $-55°$ C. to $+125°$ C.

7. A printed circuit as claimed in claim 1, in which the thickness of said layer is about $100\mu$.

8. A printed circuit as claimed in claim 1, in which said alloy is an alloy of copper-zinc-aluminum.

9. A printed circuit as claimed in claim 1, in which said alloy is an alloy of copper-zinc-tin.

* * * * *